United States Patent
Hsu

(10) Patent No.: US 6,171,968 B1
(45) Date of Patent: *Jan. 9, 2001

(54) METHOD OF FORMING DAMASCENE STRUCTURE HAVING BORDERLESS VIA DESIGN

(75) Inventor: Chen-Chung Hsu, Taichung (TW)

(73) Assignee: United Microelectronics Corp., Hsinchu (TW)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/138,623

(22) Filed: Aug. 24, 1998

(30) Foreign Application Priority Data

Jun. 12, 1998 (TW) .................................. 87109379

(51) Int. Cl.[7] .................................... H01L 21/311
(52) U.S. Cl. .......................... 438/700; 438/745; 438/756
(58) Field of Search ..................... 438/690, 691, 438/692, 694, 695, 704, 745, 756, 757

(56) References Cited

U.S. PATENT DOCUMENTS

| 5,817,572 | * | 10/1998 | Chiang et al. | .......................... 438/624 |
| 5,891,799 | * | 4/1999 | Tsui | .......................... 438/624 |
| 5,933,761 | * | 8/1999 | Lee | .......................... 438/783 |

* cited by examiner

*Primary Examiner*—Robert Kunemund
*Assistant Examiner*—Kin-Chan Chen

(57) ABSTRACT

A method of forming damascene structure has a borderless via design. The method forms a first conductive line above a substrate structure, and then forms a first dielectric layer having a via opening that exposes a portion of the first conductive layer. Thereafter, a metallic plug electrically connected to the first conductive line is formed in the via opening. Next, an insulating layer and a second dielectric layer are sequentially formed over the first dielectric layer. Subsequently, the second dielectric and the insulating layer are patterned to form a trench. Then, portions of the insulating layer at the bottom of the trench are removed to form cavity regions. Finally, a second conductive line that connects electrically with the metallic plug is formed.

18 Claims, 5 Drawing Sheets

METHOD OF FORMING DAMASCENE STRUCTURE HAVING BORDERLESS VIA DESIGN

BACKGROUND OF THE INVENTION

1. Field of Invention

The present invention relates to a method of forming a damascene structure. More particularly, the present invention relates to a method of forming a damascene structure having a borderless via or contact opening design.

2. Description of Related Art

In general, there are two methods of forming metallic lines. In the first method, a metallic layer is deposited over interconnects, and then a patterned photoresist layer is formed over the metallic layer. Thereafter, the metallic layer is etched to form the required metallic line, and finally an inter-metal dielectric (IMD) layer is deposited over the metallic line.

In the second method of forming the metallic line, a dielectric layer is first deposited over interconnects, and then a patterned photoresist layer is deposited over the dielectric layer. Thereafter, the dielectric layer is etched to form a trench, and then metallic material is deposited into the trench. Finally, a chemical-mechanical polishing (CMP) method is used to remove excess metallic material over the dielectric layer, thereby forming a damascene structure.

As the number of conductive lines required for interconnecting integrated circuit devices increases, designs having two or more metallic layers are becoming a necessity. In general, an inter-metal dielectric (IMD) layer is formed between neighboring metallic layer for isolation. In the classical method of forming via or contact opening in the dielectric layer, design rules must be followed so that a minimum width must be laid aside as the border that surrounds the via or contact opening. Therefore, if there is any misalignment between the via or contact opening and a conductive line, leakage current from the device can be prevented.

However, as the level of integration for devices continue to increase, devices having line widths of about 0.25 $\mu$m or smaller are common. When dimensions of device are so small, a borderless via or contact opening design must be used. In other words, border area surrounding the via or contact opening are not included in the design. Because there is no border area around the via or contact opening, any misalignment of the trench for forming the conductive line results in reduced contact area between conductive line and the via or contact opening. Consequently, resistance between the conductive line and the via or contact opening will increase, thereby affecting the operational speed of the device. Hence, the quality of the device may drop resulting in the lost of certain functions.

FIGS. 1A, 1B, 1C, 1D, and 1E are cross-sectional views showing the progression of manufacturing steps in forming a damascene structure having borderless via or contact opening design according to the conventional method.

First, a planarized substrate structure 100 (devices within the substrate structure 100 are not fully drawn) is provided as shown in FIG. 1A. The substrate structure 100 has a conductive line 102. The conductive line 102 can be formed, for example, by first forming a conductive layer (not shown in the figure) over the substrate structure 100, and then patterning the conductive layer to form the conductive line 102. Furthermore, the conductive line 102 is connected to a conductive region (also not shown in the figure) somewhere in the substrate structure 100.

Next, as shown in FIG. 1B, a dielectric layer 104 is formed over the substrate structure 100. For example, a chemical vapor deposition (CVD) method is used to form a silicon oxide layer over the substrate. Then, conventional photolithographic and etching operations are used to form a via opening 105 in the dielectric layer 104. The via opening 105 exposes a portion of the conductive line 102.

Next, as shown in FIG. 1C, a glue/barrier layer 106 conformal to the via opening 105 is formed over the dielectric layer 104. The glue/barrier layer 106 serves to increase adhesion between subsequently deposited metallic layer and other material layer. Thereafter, a metallic layer is deposited over the dielectric layer 104. For example, a chemical vapor deposition method is used to deposited a layer of tungsten that fills the via opening 105 making electrical connection with the conductive line 102. Subsequently, the tungsten layer is either etched back or planarized using a chemical-mechanical polishing method to remove redundant material above the dielectric layer 104. Ultimately, a via plug 108 is formed.

Next, as shown in FIG. 1D, another dielectric layer 114 is formed over the dielectric layer 104. For example, a chemical vapor deposition (CVD) method is used to deposit a silicon oxide layer. Then, conventional photolithographic and etching operations are used to form a trench 115 in the dielectric layer. The trench 115 exposes a portion of the via plug 108. Due to misalignment of the trench 115, a subsequently formed conductive line in the trench 115 will have a smaller contact area with the via plug 108. Consequently, resistance between the conductive line and the via plug 108 will greatly increase.

Next, as shown in FIG. 1E, a conductive layer 112 is deposited over the dielectric layer 114. For example, metallic material such as copper, aluminum, or aluminum-copper alloy is deposited into the trench 115. Then, a chemical-mechanical polishing (CMP) operation is carried out to remove excess conductive layer above the dielectric layer 114. Therefore, a conductive line 112 having electrical connection with the via plug 108 is formed. However, contact area between the conductive line 112 and the via plug 108 is greatly reduced due to the misaligned trench 115. Hence, there is a high contact resistance between the conductive line 112 and the via plug 108.

In light of the foregoing, there is a need to improve the method of forming a damascene structure that has a borderless via or contact opening design.

SUMMARY OF THE INVENTION

Accordingly, the present invention provides a method of forming a damascene structure having a borderless via design such that despite any misalignment between the conductive line and the via plug, contact area between the conductive line and the via plug can be maintained, and hence contact resistance between the conductive line and the via plug can be kept at a minimum.

To achieve these and other advantages and in accordance with the purpose of the invention, as embodied and broadly described herein, the invention provides a method of forming damascene structure having a borderless via design. The method comprises the steps of forming a first conductive line above a substrate structure, and then forming a first dielectric layer having a via opening that exposes a portion of the first conductive layer. Thereafter, a metallic plug electrically connected to the first conductive line is formed in the via opening. Next, an insulating layer and a second dielectric layer are sequentially formed over the first dielectric layer. Subsequently, the second dielectric and the insulating layer are patterned to form a trench. Then, portions of the insulating layer at the bottom of the trench are removed to from cavity regions. Finally, a second conductive line that connects electrically with the metallic plug is formed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
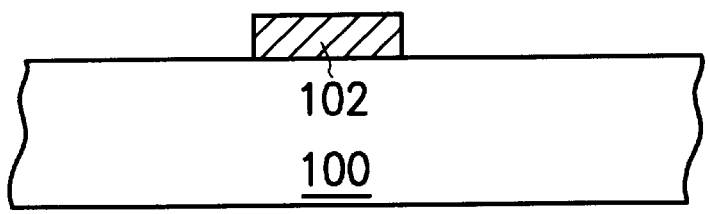
FIGS. 1A, 1B, 1C, 1D, and 1E are cross-sectional views showing the progression of manufacturing steps in forming a damascene structure having borderless via or contact opening design according to the conventional method.
Figure 1B:
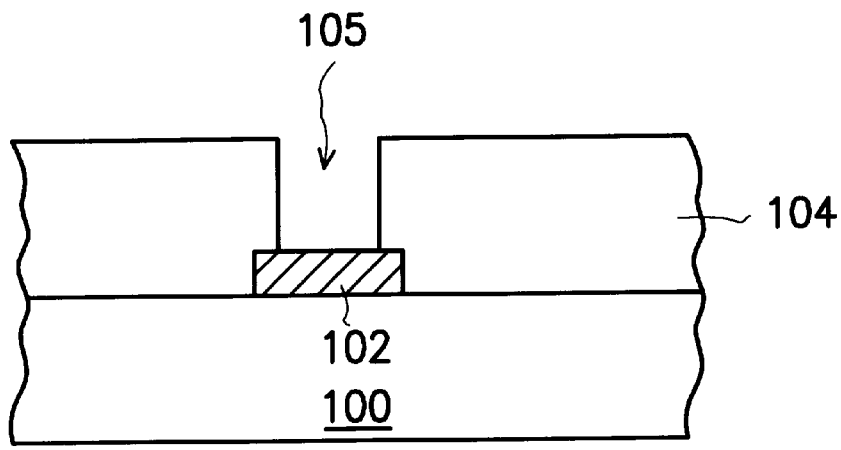
Figure 1C:
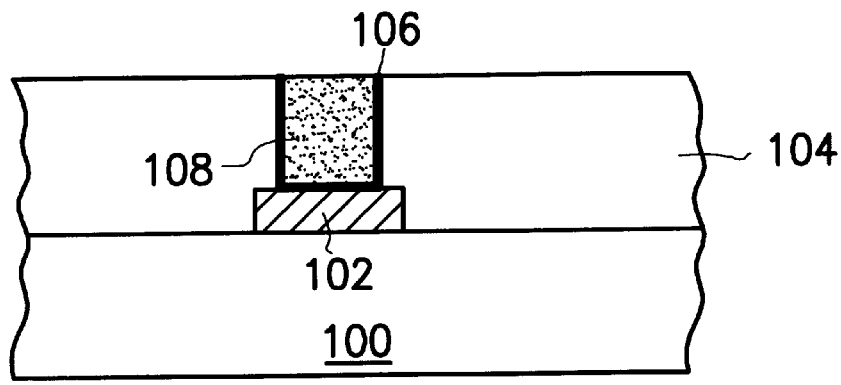
Figure 1D:
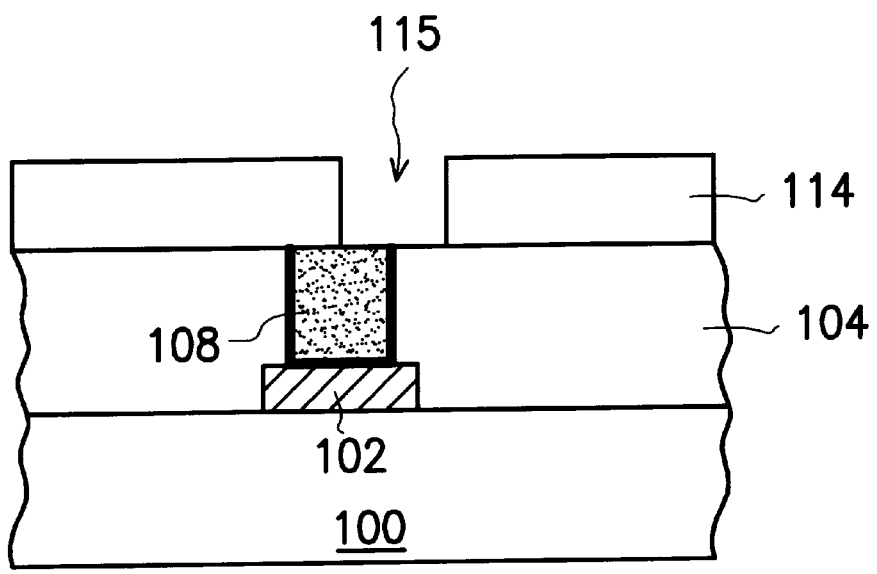
Figure 1E:
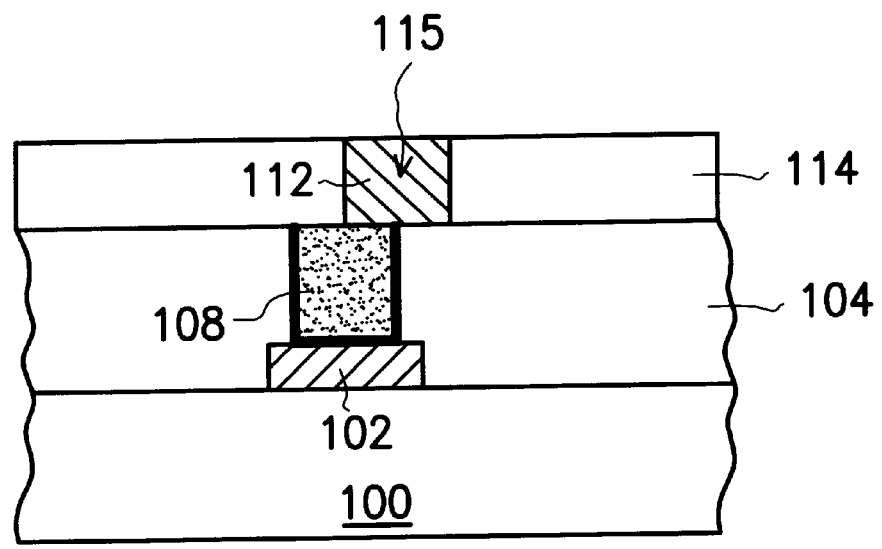

Reference will now be made in detail to the present preferred embodiments of the invention, examples of which are illustrated in the accompanying drawings. Wherever possible, the same reference numbers are used in the drawings and the description to refer to the same or like parts.

FIGS. 2A, 2B, 2C, 2D, 2E, 2F, and 2G, are cross-sectional views showing the progression of manufacturing steps in forming a damascene structure having a borderless via or contact opening according to one preferred embodiment of this invention.

Figure 2A:
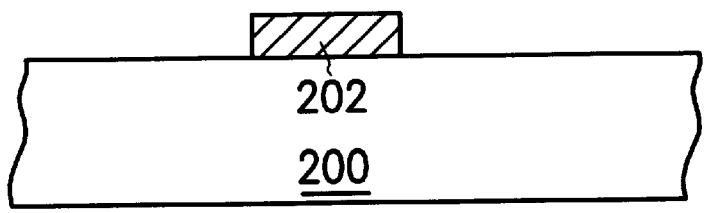
FIGS. 2A, 2B, 2C, 2D, 2E, 2F, and 2G are cross-sectional views showing the progression of manufacturing steps in forming a damascene structure having borderless via or contact opening design according to one preferred embodiment of this invention.

First, a planarized substrate structure 200 (devices within the substrate structure 200 are not fully drawn) is provided as shown in FIG. 2A. The substrate structure 200 has a conductive line 202. The conductive line 202 can be formed, for example, by first forming a conductive layer (not shown in the figure) over the substrate structure 200, and then patterning the conductive layer to form the conductive line 202. Preferably, the conductive layer is formed using a material selected from copper, aluminum and aluminum-copper alloy. Furthermore, the conductive line 202 is connected to a conductive region (also not shown in the figure) somewhere in the substrate structure 200.

Figure 2B:
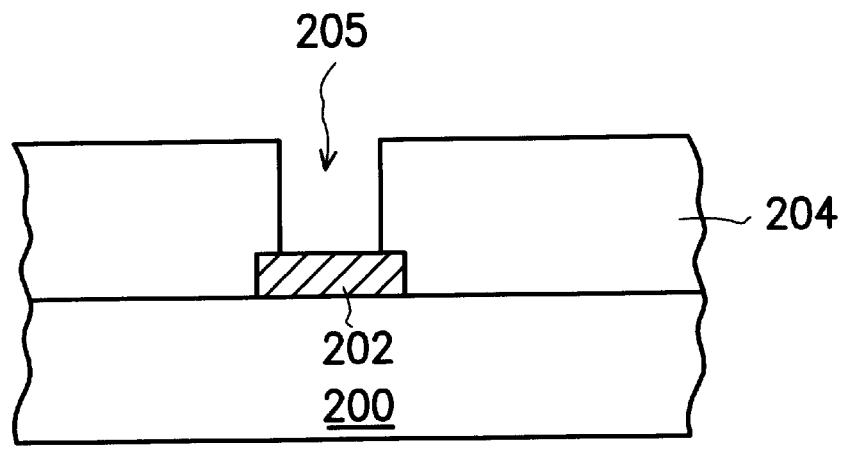

Next, as shown in FIG. 2B, a dielectric layer 204 is formed over the substrate structure 200. For example, a chemical vapor deposition (CVD) method is used to form a silicon oxide layer over the substrate. Then, conventional photolithographic and etching operations are used to form a via opening 205 in the dielectric layer 204. The via opening 205 exposes a portion of the conductive line 202.

Figure 2C:
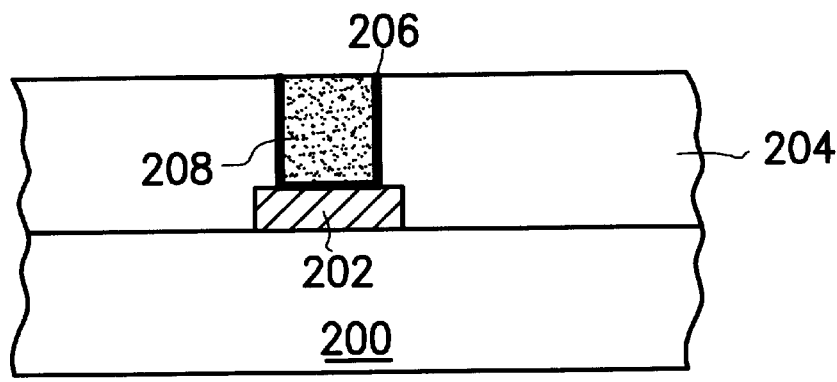

Next, as shown in FIG. 2C, a glue/barrier layer 206 conformal to the via opening 205 is formed over the dielectric layer 204. The glue/barrier layer 206 serves to increase adhesion between the subsequently deposited metallic layer and other material layer. Thereafter, a metallic layer is deposited over the dielectric layer 204. For example, a chemical vapor deposition method is used to deposite a layer of tungsten that fills the via opening 205 and makes electrical connection with the conductive line 202. Subsequently, the metallic layer is either etched back or planarized using a chemical-mechanical polishing method to remove redundant material above the dielectric layer 204. Ultimately, a via plug 208 is formed.

Figure 2D:
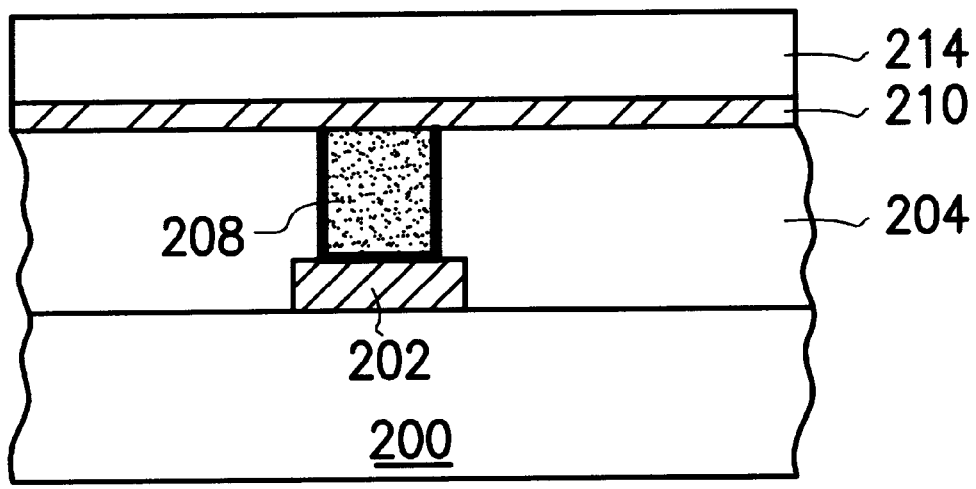

Next, as shown in FIG. 2D, an insulating layer 210 is formed over the dielectric layer 204. For example, a chemical vapor deposition (CVD) method can be used to deposit a silicon nitride layer ($SiN_x$) or a borophosphosilicate glass (BPSG) layer. The insulating layer 210 covers at least the dielectric layer 204 and the via plug 208. Thereafter, another dielectric layer 214 is formed over the insulating layer 210. For example, a chemical vapor deposition (CVD) method is used to deposit a silicon oxide layer over the insulating layer 210.

Figure 2E:
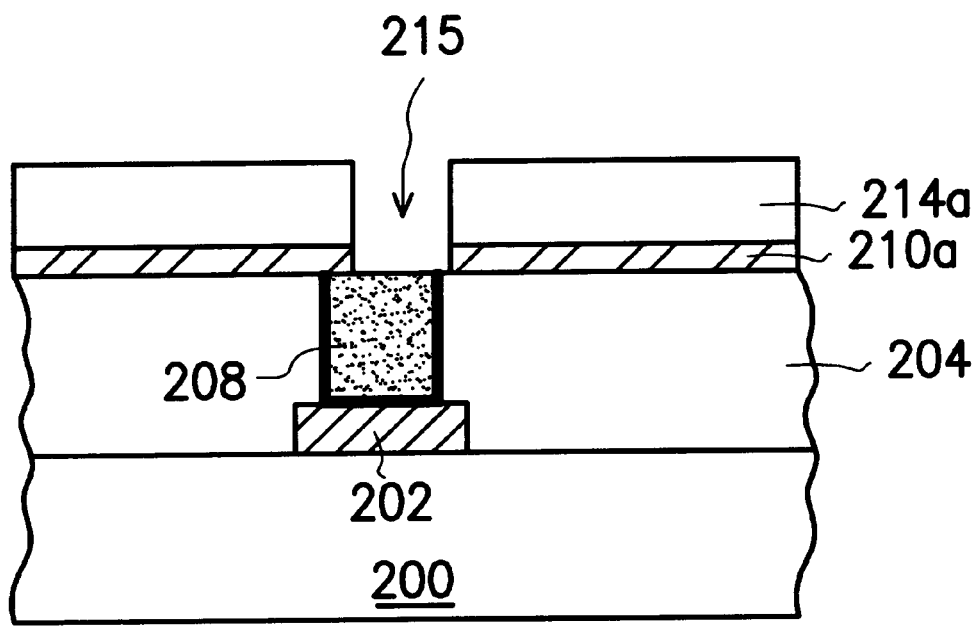

Next, as shown in FIG. 2E, conventional photolithographic and etching operations are used to remove a portion of the dielectric layer and the insulating layer 210 using, for example, a reactive ion etching (RIE) method. Hence, a trench 215 is formed in the dielectric layer 214a and the insulating layer 210a. The trench 215 exposes a portion of the via plug 208. If the trench 215 is formed with misalignment relative to the via plug 208 and a conductive line is subsequently formed in the trench 215, the conductive line will have a smaller contact area with the via plug 208. Therefore, resistance between the conductive line and the via plug 108 will greatly increase. However, the next two steps as shown in FIGS. 2F and 2G are capable of improving the situation.

Figure 2F:
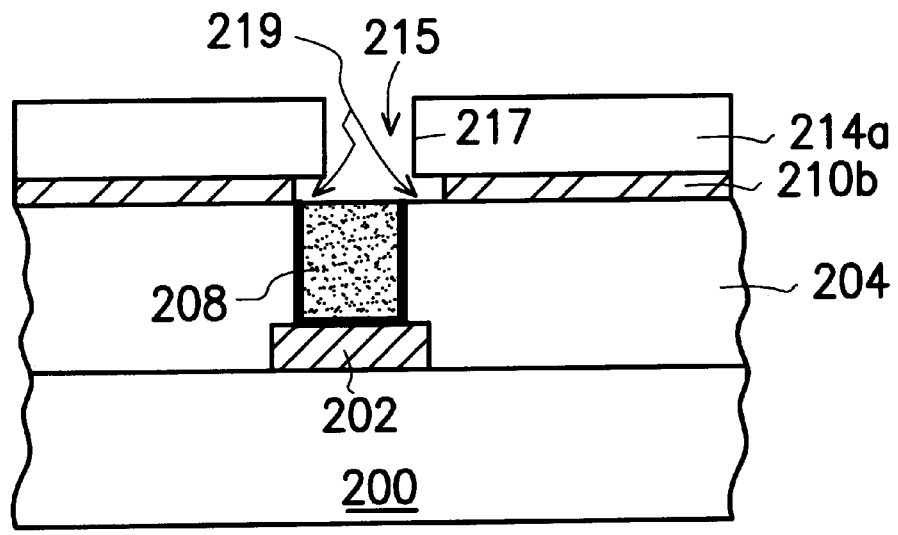
Figure 2G:
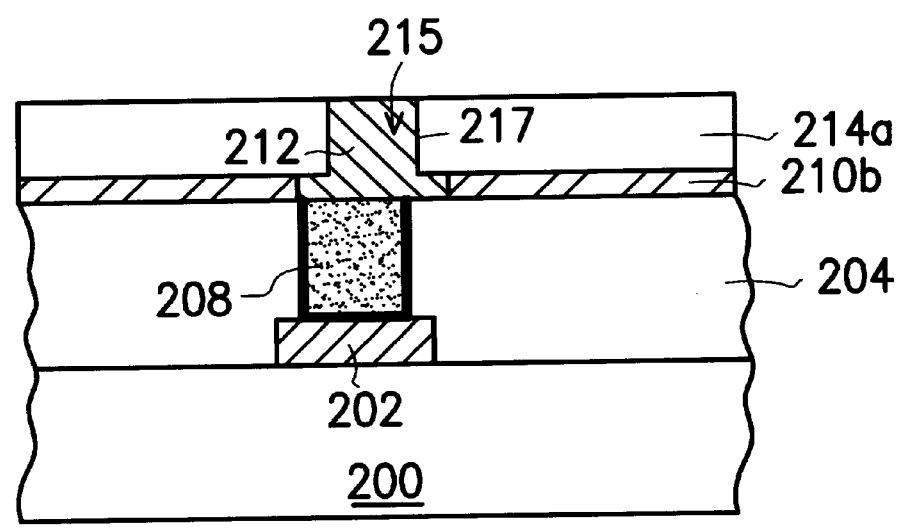

Next, as shown in FIG. 2F, a portion of the insulating layer 210a on the sidewalls 217 at the bottom of the trench 215 is removed to form an insulating layer 210b having cavity regions 219. The cavity regions are preferably formed by a wet etching method. For example, when the insulating layer 210a is a silicon nitride layer, hot phosphoric acid can be used in the wet etching operation.

On the other hand, if the insulating layer 210a is a borophosphosilicate glass (BPSG) layer, since BPSG is a silicon oxide layer having doped impurities including boron and phosphorus, an etchant having a higher etching rate for the BPSG layer than for the dielectric layer 204 and the dielectric layer 214a can be chosen to carry out the etching operation. The cavity region 219 increases the area at the bottom of the trench 215.

Hence, a subsequently formed conductive line in the cavity region 219 and the trench 215 will have a larger contacting area with the via plug 208. Consequently, the reduction of contact area between the trench 215 and the via plug 208 resulting from a trench misalignment can be mostly compensated for. Thus, contact resistance between the via plug 208 and the trench 215 can be lowered.

Next, as shown in FIG. 2G, a conductive layer 212 is deposited over the dielectric layer 214a. For example, metallic material such as copper, aluminum, or aluminum-copper alloy is deposited into the trench 215. The metallic material fills not only the trench 215, but also the cavity regions 219 at the bottom of the trench 215. Then, a chemical-mechanical polishing (CMP) operation is carried out to remove excess conductive material above the dielectric layer 214a.

Therefore, a conductive line 212 having electrical connection with the via plug 208 is formed. Due to the presence of cavity regions 219 at the bottom of the trench 215, portions of the conductive line in the cavity regions 219 are capable of increasing its contact area with the via plug 208.

Consequently, the reduction in contact area due to trench misalignment can be compensated for and a high contact resistance between the conductive line 212 and the via plug 208 is prevented.

In summary, major aspects of this invention include:
1. A method of forming damascene structure having a borderless via or contact opening design is provided. In this invention, an insulating layer, for example, a silicon nitride layer or a BPSG layer is added between the via plug and the dielectric layer above. Furthermore, after a trench is formed in the dielectric layer and the insulating layer, portions of the insulating layer are removed to form cavity regions at the bottom of the trench. Therefore, when metallic material are deposited into the trench and the cavity region, greater contact area between the conductive line and the via plug is established. Hence, reduced contact area arising out of trench misalignment can be compensated for by the wider conductive line at the bottom of the trench. Thus, contact resistance between the conductive line and the via plug can be lowered.
2. Fabricating processes for forming the structure are compatible with current semiconductor manufacturing practice, and hence can be easily incorporated into a production line.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of forming a damascene structure having borderless via design, the method comprising the steps of:
   providing a substrate structure;
   forming a first conductive line over the substrate structure;
   forming a first dielectric layer over the first conductive line and the substrate structure, wherein the first dielectric layer has an opening that exposes a portion of the first conductive line;
   forming a plug in the opening such that the plug is electrically connected to the first conductive line;
   forming an insulating layer and then a second dielectric layer over the first dielectric layer;
   patterning the second dielectric layer and the insulating layer to form a trench that exposes a portion of the plug, wherein a sidewall of the insulating layer in the trench is naturally exposed;
   removing a portion of the insulating layer from the sidewall of the insulating layer within the trench, so as to form a cavity region, which further expose the plug;
   forming a conductive layer over the second dielectric layer that also fills the trench and the cavity region, wherein the cavity region allows the conductive layer to have a larger contact area to the plug than that in the trench; and
   planarizing the conductive layer to remove excess conductive material over the second dielectric layer, hence forming a second conductive line in the trench and the cavity region, wherein the second conductive line is electrically coupled to the plug.

2. The method of claim 1, wherein the first conductive line can be made from a material selected from the group consisting of copper, aluminum and aluminum-copper alloy.

3. The method of claim 1, wherein the step of forming the first dielectric layer include depositing silicon oxide.

4. The method of claim 1, wherein the step of forming the plug includes depositing tungsten into the via opening.

5. The method of claim 1, wherein the step of forming the plug further includes forming a glue/barrier layer conformal to the via opening.

6. The method of claim 5, wherein the step of forming the glue/barrier layer includes forming a titanium/titanium nitride composite layer or a tantalum/tantalum nitride composite layer.

7. The method of claim 1, wherein the step of forming the insulating layer includes depositing silicon nitride or borophosphosilicate glass.

8. The method of claim 1, wherein the step of forming the insulating layer includes a chemical vapor deposition method.

9. The method of claim 1, wherein the step of removing the portion of the insulating layer includes a wet etching.

10. The method of claim 1, wherein the second conductive line can be made from a material selected from the group consisting of copper, aluminum and aluminum-copper alloy.

11. The method of claim 1, wherein the step of planarizing the conductive layer includes a chemical-mechanical polishing method.

12. A method of forming a damascene structure having borderless via design, wherein a substrate structure having a first dielectric layer with a plug already formed thereon is provided, the method comprising the steps of:
   forming an insulating layer and then a second dielectric layer over the first dielectric layer;
   patterning the second dielectric layer and the insulating layer to form a trench to expose a portion of the plug, wherein the trench also exposes a sidewall of the insulating layer;
   removing a portion of the insulating layer from the sidewall within the trench, so as to form a cavity region that further expose the plug; and
   forming a conductive line in the trench as well as the cavity region, wherein the conductive line is electrically coupled to the plug and wherein the cavity region allows the conductive line to have a larger contact area to the plug than that in the trench.

13. The method of claim 12, wherein the step of forming the insulating layer includes depositing silicon nitride or borophosphosilicate glass.

14. The method of claim 12, wherein the step of forming the insulating layer includes a chemical vapor deposition method.

15. The method of claim 12, wherein the step of removing the portion of the insulating layer includes a wet etching.

16. The method of claim 12, wherein the conductive line can be made from a material selected from the group consisting of copper, aluminum and aluminum-copper alloy.

17. The method of claim 12, wherein the step of forming the conductive line further includes the substeps of:
   forming a conductive layer over the second dielectric layer and filling the trench as well as the cavity regions; and
   planarizing the conductive layer to expose the second dielectric layer.

18. The method of claim 17, wherein the step of planarizing the conductive layer includes a chemical-mechanical polishing method.

* * * * *